Dec. 25, 1962 E. R. KEELER ETAL 3,070,752

TRANSISTORIZED POWER DRIVER PULSE AMPLIFIER

Filed July 8, 1960

INVENTORS
EUGENE R. KEELER
THEODORE W. KWAP
BY
ATTORNEY.

United States Patent Office 3,070,752

Patented Dec. 25, 1962

3,070,752

TRANSISTORIZED POWER DRIVER PULSE AMPLIFIER

Eugene R. Keeler, Flushing, and Theodore W. Kwap, Brewster, N.Y., assignors to General Precision, Inc., a corporation of Delaware Filed July 8, 1960, Ser. No. 41,596

4 Claims. (Cl. 330—22)

This invention relates to electronic amplifying circuits and particularly to such circuits for amplifying the power of high-speed pulses.

A high-frequency train of short, rectangular pulses of potential is widely used to time the actions of electronic computers. Such a pulse train is often termed a clock pulse train. In a computer it may be necessary to supply simultaneously a number of circuits with such clock pulses. When the circuits require more power to drive them than can be secured from the clock pulse generator, power amplifiers must be provided. The present invention provides such a power amplifier.

When the load on such a power amplifier is capacitive as well as resistive, as when the load consists of AND circuits, conventional circuit time constants become so great that the short pulses are distorted in shape.

The present invention eliminates this distortion and provides sharp-corned one-microsecond clock pulses at high frequency to a highly capacitive load.

The purpose of this invention is to provide a clock pulse drive for highly capacitive loads.

The invention provides a single-stage transistor amplifier to which the input clock pulses are applied through an inverter. A correcting transistor is connected to the capacitive load in such a way as to provide a low-resistance path through which the capacitive load is charged at the time of the leading edge of each clock pulse. In addition, the capacitance of the load is at this time placed in series with a fixed capacitance to reduce the overall time constant. The load capacitance is discharged at the time of each pulse trailing edge through the low resistance constituted by the conductive, single-stage transistor amplifier.

The invention will, however, be better understood from the following description when considered in connection with the accompanying drawings in which.

Figure 1:
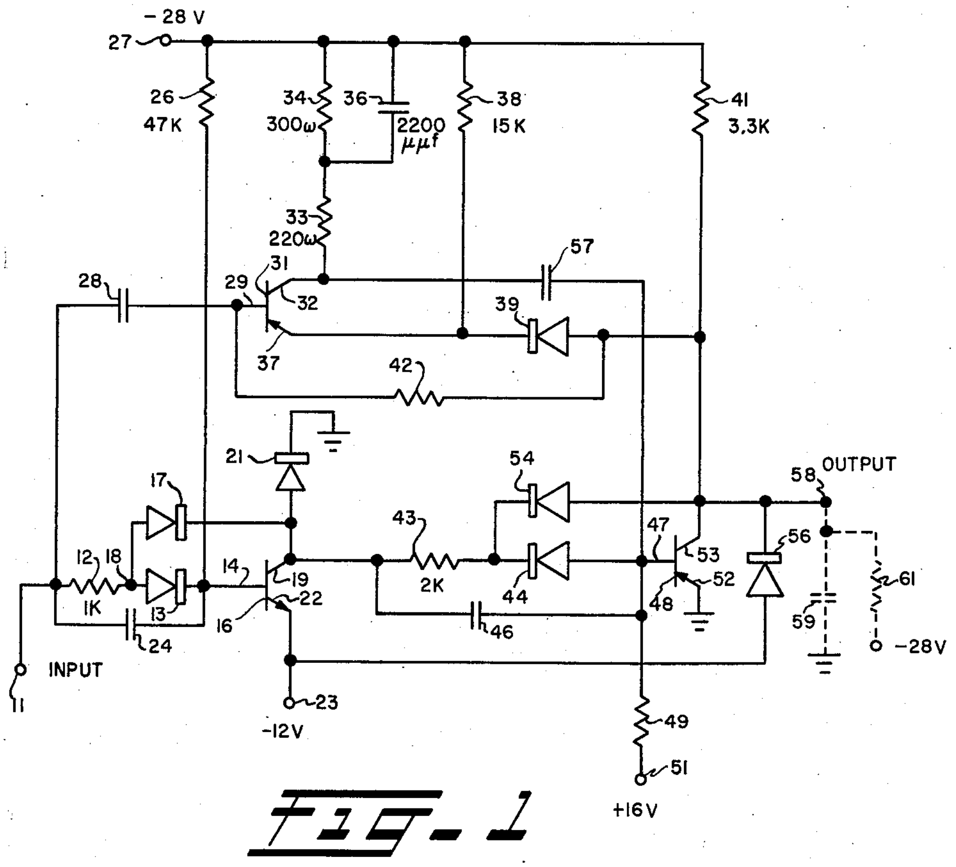
FIGURE 1 is a schematic circuit diagram of an embodiment of the invention.

Referring now to FIGURE 1, an input terminal 11 is connected through a small resistance 12 and a silicon diode 13 to the base 14 of a germanium transistor 16. A germanium diode 17 is connected between the input terminal 18 of diode 13 and the collector 19 of the inverter transistor 16. The collector 19 is connected to ground through a diode 21 and the emitter 22 is connected to the terminal 23 of a source having a potential of −12 volts. The input terminal 11 is coupled through a capacitor 24 to the base 14. The base 14 is connected through a large resistance 26 to the terminal 27 of a −28 volt source.

The input terminal 11 is also coupled through a capacitor 28 to the base 29 of a transistor 31. The collector 32 of this transistor is connected to the −28 volt source through two small resistances, 33 and 34, in series, the latter being shunted by a capacitor 36. The emitter 37 is connected to a −28 volt power supply terminal through a resistor 38. The emitter 37 is also connected to the same power source through a diode 39 and resistor 41. The base 29 is connected to the −28 volt power supply terminal through resistors 42 and 41.

The output of transistor 16 is taken from its collector 19. This output is connected through a resistor 43 and diode 44, shunted by a capacitor 46, to the base 47 of a transistor 48. The base 47 is also connected through a resistor 49 to the terminal 51 of a +16 volt power source. The emitter 52 is grounded and the collector 53 is connected through resistor 41 to the power supply terminal 27. A diode 54 is connected between the input of diode 44 and the collector 53. A diode 56 is connected between collector 53 and power supply terminal 23. A capacitor 57 is connected between the base 47 of transistor 48 and the collector 32 of the transistor 31. Thus the transistor 48 constitutes a common-emitter transistor amplifier. The system output at terminal 58 is taken from collector 53.

In the operation of this circuit a train of negative pulses, which may be obtained, for example, from a clock pulse generator, is applied to the instrument input terminal 11. This pulse train may consist of one-microsecond pulses spaced ten microseconds apart. During the 10 $\mu$s. space interval the input potential to ground is zero and the input source impedance is about 30 ohms. During the 1$\mu$s. pulse interval the input potential to ground is −15 volts and the impedance is about 600 ohms.

The diode 13 is conductive at all times because of the closed path from terminal 27 through resistor 26 and the diode 13, then through resistor 12 to the input source at terminal 11. Therefore, this silicon diode 13 merely introduces a resistive drop of about 0.8 volt in the base path of transistor 16.

Figure 2:
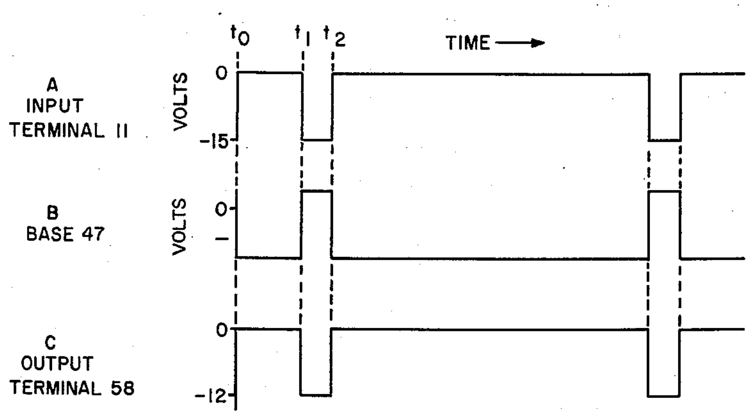
FIGURE 2 are graphs illustrating the operation of the circuit of the invention.

The space potential of zero applied to the input terminal 11 is transmitted to the base 14 of the common-emitter NPN transistor 16. Since this applied potential is more positive than the emitter potential of −12 volts, this transistor is made conductive. This applies approximately −12 volts through resistor 43 and diode 44, which is always conductive, to the base 47 of the PNP transistor 48. Since this makes the base 47 more negative than the emitter 52, the transistor 48 becomes conductive. This condition of the transistors 16 and 48 is shown in the graphs of FIGURE 2. At the time $t_0$ the input terminal, Graph A, is at zero, the collector 19 is at about −12 volts, the base 47, Graph B, is more negative than ground and the collector 53 of transistor 48 and also the output terminal 58, Graph C, are at about zero volts.

At the time $t_1$ the leading edge of the downgoing input pulse occurs. The input potential change to −15 volts makes transistor 16 nonconductive so that positive potential from the source 51 makes diode 21 conductive, and the current flow causes collector 19 to assume a potential of about +0.8 volt. The base 47 rises to a higher positive potential. This makes transistor 48 nonconductive and the collector 53 increases in negative potential toward the potential of terminal 27, namely, −28 volts. However, a limit diode 56 is provided to limit the rise to its source 23 potential of −12 volts. These voltage changes are shown ideally at time $t_1$ in the Graphs A, B and C.

If the circuit operation were limited to that so far described, the rise of potential of the output terminal 58 would be along an exponential curve when the load connected to terminal 58 is capacitive. As an example, let this capacitive load amount to 10,000 $\mu\mu$f., associated with resistance in some manner such as indicated by the dashed capacitor 59 and resistor 61. Charging of the capacitance of capacitor 59 toward −28 volts will then occur along an exponential curve having a time constant of several microseconds, and the rise to −12 volts would be too slow for −12 volts to be attained in the pulse time of 1 $\mu$s.

In order to overcome this difficulty, the PNP transistor 31 stage is provided to serve as a controllable or adjustable impedance shunting the resistor 41. Its operation is as follows: At time $t_0$ the bias on the base 29 is more positive than the potential on the emitter 37 because of a drop of 0.3 volt potential through diode 39, while at the currents involved the small resistor 42 introduces substantially no potential drop. Therefore, the transistor 31 is nonconductive.

At time $t_1$, —15 volts applied from terminal 11 through capacitor 28 to base 29 makes transistor 31 highly conductive, its internal resistance falling to about 10 ohms, and it draws emitter current from the charge in the load capacitance 59. This action shunts the relatively large resistance 41 by a low resistance path consisting of diode 39, transistor 31, resistor 33 and capacitor 36. Pulse currents take the path through capacitor 36 rather than through resistor 34. Thus the time constant of the capacitor 59 has, as its resistance component, that of resistor 41 in shunt with resistors 61 and 33. Moreover, the effect of the capacitance of capacitor 59 is greatly reduced because it is in series, in part of the charging circuit, with capacitor 36.

The rise time of the leading edge of the 1 $\mu$s. pulse is by this means shortened to less than one-tenth microsecond.

At time $t_2$ the input pulse falls to zero potential, making transistors 16 and 48 conductive and restoring the nonconductivity of transistor 31. The discharge of the load capacitance 59 at this trailing edge of the pulse is rapid because it is through the low resistance of the highly conducting transistor 48.

The circuits of transistor 16 and 48 are similar. The limit diode 21 limits the rise in potential of collector 19 to slightly above zero volts, while limit diode 56 limits the rise of collector 53 to about —12 volts. Silicon diode 13 and germanium diode 17 together eliminate saturation delay in transistor 16. This well-known phenomenon, which occurs when a saturated transistor is suddenly made nonconductive, may otherwise amount to as much as 9 $\mu$s. The drop through the silicon diode 13 is about 0.8 volt while that through the germanium diode 17 is about 0.5 volt. Thus under the conditions of operation, by controlling the relative potentials of the base and emitter, saturation is prevented and no saturation delay is experienced. The silicon diode 44 and germanium diode 54 have the same function in association with transistor 48. The resistors 12 and 43 limit base currents when their transistors are conductive.

The capacitor 24 has the function of increasing the speed of response of transistor 16 to changes in voltage at the input terminal 11, particularly at time $t_2$ when the transistor becomes conductive. The capacitor 46 associated with transistor 48 has a similar function.

The function of capacitor 57 is to reinforce the turnoff of transistor 48. At the time $t_1$ when transistor 31 becomes conductive, an upgoing voltage step of about 13 volts is coupled by capacitor 57 to the base 47 of transistor 48. This hastens the increase of positive potential of the base beyond that of the emitter, causing quicker cutoff of the transistor emitter-to-collector current.

The resistor 38 has two functions: it provides a path to the —28 volt potential source for the load connected to the output terminal 58. This is necessary when the connected load consists of AND circuits, for example. The second function of resistor 38 is to maintain current through the diode 39, thus keeping it conductive at all times.

The circuit of FIGURE 1 receives negative clock pulses and emits negative driver pulses. However, an exact equivalent of this circuit for power amplifying positive pulses is secured by substituting NPN transistors for PNP transistors and vice versa, by reversing all diodes and by reversing the polarities of all power supplies.

What is claimed is:

1. A driver circuit comprising first and second common-emitter transistor amplifier stages in tandem, the transistor of said second amplifier stage having at least a collector, base and emitter, a resistor in series with said collector, means applying a pulse train to said first amplifier stage, means including capacitance loading said second amplifier stage collector output, a transistor stage comprising a controllable impedance shunting said resistor and means for simultaneously applying said pulse train to said transistor stage whereby during the time of the leading edge of each pulse of the pulse train the impedance of said transistor stage is lowered permitting said capacitance load to charge rapidly.

2. A driver circuit comprising first and second common-emitter transistor amplifier stages in tandem, said first amplifier stage being an inverter stage and having a base input terminal, said second amplifier stage including a first collector resistor and having a collector output terminal, a diode limiter connected to said collector output terminal, a capacitive load connected to said collector output terminal, a third common-emitter transistor stage including a second collector resistor shunted by a capacitor and having a base input terminal, said third stage shunting said first collector resistor and means applying a pulse train to said base input terminals of said first and third stages whereby said third stage serves as low-resistance shunt across said first collector resistor during only the leading edge time of each pulse permitting rapid charging of said capacitive load and whereby said second transistor stage serves as a low-resistance shunt across said collector resistor during the trailing edge time of each pulse permitting rapid discharging of said capacitive load.

3. A driver circuit comprising first and second common-emitter transistor amplifier stages connected in tandem, said first and second stages being inverter stages having base inputs and collector outputs, said second stage including a collector resistor, a diode limiter connected to said second stage collector output, a third common-emitter transistor stage comprising an adjustable impedance, said third stage including two collector resistors in series one being shunted by a capacitor, said third stage having a capacitor-coupled base input terminal, said third stage having bias means connected to the emitter and base thereof, said third stage shunting said second stage collector resistor, a capacitor connected between said third stage collector and said second stage base, a capacitive load connected to said second stage collector, and means applying a pulse train to the inputs of said first and third stages whereby said third stage applies low impedance across said second stage collector resistor only during the leading edge of each pulse of the pulse train thereby causing accelerated charging of said capacitive load and whereby said second stage applies low impedance across said capacitive load during the trailing edge of each pulse of the pulse train thereby causing accelerated discharging of said capacitive load.

4. A driver circuit in accordance with claim 3 including means for eliminating saturation delays in said first and second stages.

References Cited in the file of this patent

UNITED STATES PATENTS

| | | |
|---|---|---|
| 2,312,194 | Roder | Feb. 23, 1943 |
| 2,783,314 | Reaves | Feb. 26, 1957 |
| 2,783,316 | Clapper | Feb. 26, 1957 |
| 2,908,774 | Hals | Oct. 13, 1959 |